United States Patent
Furusawa et al.

(10) Patent No.: US 8,421,246 B2
(45) Date of Patent: Apr. 16, 2013

(54) JOINT STRUCTURE AND ELECTRONIC COMPONENT

(75) Inventors: Akio Furusawa, Osaka (JP); Shigeaki Sakatani, Osaka (JP); Taichi Nakamura, Osaka (JP); Takahiro Matsuo, Osaka (JP)

(73) Assignee: Panasonic Corporation, Osaka (JP)

( * ) Notice: Subject to any disclaimer, the term of this patent is extended or adjusted under 35 U.S.C. 154(b) by 489 days.

(21) Appl. No.: 12/864,826

(22) PCT Filed: May 22, 2009

(86) PCT No.: PCT/JP2009/002265
§ 371 (c)(1),
(2), (4) Date: Jul. 27, 2010

(87) PCT Pub. No.: WO2009/157130
PCT Pub. Date: Dec. 30, 2009

(65) Prior Publication Data
US 2010/0301481 A1 Dec. 2, 2010

(30) Foreign Application Priority Data
Jun. 23, 2008 (JP) .................. 2008-162903

(51) Int. Cl.
*H01L 29/43* (2006.01)
(52) U.S. Cl.
USPC .......... 257/779; 257/741; 257/748; 257/750; 257/751; 257/E23.155
(58) Field of Classification Search ........... 257/741, 257/742, 748, 750, 751, 762, 766, 779, E23.017, 257/257/E23.023, E23.028, E23.072, E23.154, 257/E23.155, E23.157

See application file for complete search history.

(56) References Cited

U.S. PATENT DOCUMENTS
| | | | |
|---|---|---|---|
| 4,663,649 A | 5/1987 | Suzuki et al. | |
| 4,769,690 A * | 9/1988 | Suzuki et al. | ........... 257/744 |
| 4,935,336 A | 6/1990 | Yamada et al. | |

(Continued)

FOREIGN PATENT DOCUMENTS
| | | |
|---|---|---|
| EP | 1 399 600 | 1/2007 |
| EP | 1 914 035 | 4/2008 |

(Continued)

OTHER PUBLICATIONS

Chinese Office Action issued in Chinese Patent Application No. 200980115918.8 dated Jul. 27, 2012.

(Continued)

*Primary Examiner* — Eduardo A Rodela
(74) *Attorney, Agent, or Firm* — McDermott Will & Emery LLP

(57) ABSTRACT

A joint structure joins an electronic element 12 included in an electronic component to an electrode 14 included in that electronic component. The joint structure includes a solder layer, which contains 0.2 to 6% by weight of copper, 0.02 to 0.2% by weight of germanium and 93.8 to 99.78% by weight of bismuth, a nickel layer provided between the solder layer and the electrode, and a barrier layer provided between the nickel layer and the solder layer. Here, the barrier layer is formed so as to have an average thickness of from 0.5 to 4.5 μm after the electronic element and the electrode are joined by the solder layer.

11 Claims, 4 Drawing Sheets

U.S. PATENT DOCUMENTS

| | | | | |
|---|---|---|---|---|
| 5,415,944 | A | 5/1995 | Kazem-Goudarzi et al. | |
| 6,156,132 | A | 12/2000 | Yamashita et al. | |
| 6,365,097 | B1 | 4/2002 | Yamashita et al. | |
| 6,554,180 | B1 | 4/2003 | Katoh et al. | |
| 6,649,127 | B2 * | 11/2003 | Habu et al. | 420/561 |
| 6,652,968 | B1 | 11/2003 | Miller | |
| 6,703,113 | B2 | 3/2004 | Takaoka et al. | |
| 7,345,570 | B2 | 3/2008 | Kawanishi | |
| 2002/0012608 | A1 | 1/2002 | Takaoka et al. | |
| 2002/0106302 | A1 | 8/2002 | Habu et al. | |
| 2003/0111728 | A1 | 6/2003 | Thai et al. | |
| 2004/0170524 | A1 | 9/2004 | Lambracht et al. | |
| 2005/0006778 | A1 | 1/2005 | Shinyama et al. | |
| 2005/0029666 | A1 | 2/2005 | Kurihara et al. | |
| 2005/0218525 | A1 | 10/2005 | Takahashi et al. | |
| 2006/0113683 | A1 | 6/2006 | Dean et al. | |
| 2006/0193744 | A1 | 8/2006 | Yang | |
| 2006/0239854 | A1 | 10/2006 | Uenishi et al. | |
| 2006/0246304 | A1 | 11/2006 | Ishihara et al. | |
| 2009/0242249 | A1 * | 10/2009 | Furusawa et al. | 174/259 |
| 2010/0035072 | A1 | 2/2010 | Watanabe et al. | |
| 2010/0294550 | A1 * | 11/2010 | Furusawa et al. | 174/259 |

FOREIGN PATENT DOCUMENTS

| | | |
|---|---|---|
| EP | 2 036 656 A1 | 3/2009 |
| JP | 2001-205477 | 7/2001 |
| JP | 2004-025232 | 1/2004 |
| JP | 2004-114093 | 4/2004 |
| JP | 2006-167790 | 6/2006 |
| JP | 2006-310507 | 11/2006 |
| JP | 2007-90407 | 4/2007 |
| JP | 2007-281412 | 10/2007 |
| JP | 2007-313526 | 12/2007 |
| WO | WO 02/097145 | 12/2002 |
| WO | WO 02/101105 | 12/2002 |
| WO | WO 2007/018288 | 2/2007 |

OTHER PUBLICATIONS

European Search Report issued in European Patent Application No. 07743702.8 dated Feb. 2, 2010.

US Office Action issued in U.S. Appl. No. 12/302,157 dated Jun. 9, 2011.

US Office Action issued in U.S. Appl. No. 12/302,157 dated Dec. 9, 2010.

US Office Action issued in U.S. Appl. No. 12/302,157 dated Feb. 17, 2012.

* cited by examiner

JOINT STRUCTURE AND ELECTRONIC COMPONENT

RELATED APPLICATIONS

This application is the U.S. National Phase under 35 U.S.C. §371 of International Application No. PCT/JP2009/002265, filed on May 22, 2009, which in turn claims the benefit of Japanese Application No. 2008-162903, filed on Jun. 23, 2008, the disclosures of which Applications are incorporated by reference herein.

TECHNICAL FIELD

The present invention relates to joint structures, particularly to technology for increasing durability of a joint structure for joining an electronic element included in an electronic component to an electrode included in that electronic component.

BACKGROUND ART

Electronic components such as power transistors are in many cases configured by joining electronic elements, such as semiconductor elements, directly to at least one electrode. FIG. 7 is a view of an exemplary conventional power transistor, providing a partial perspective of a casing. The transistor 100 shown as an example has a semiconductor element 104 disposed within the casing 102 and directly joined to one electrode 106. The semiconductor element 104 is also connected to two other electrodes 108 and 110 via wires. Such a conventional power transistor typically uses solder at a joint for joining the semiconductor element 104 directly to the aforementioned one electrode.

Solder is also used at a joint for mounting the electronic component, such as a power transistor, onto another board. Most solder materials used for mounting the electronic component, such as a power transistor, onto another board have a melting point of from 200 to 230° C.

For soldering in such a case, joining is generally carried out by means of a solder immersion-type dip device. In this case, the solder material is required to be heated to 250 to 260° C., and therefore, in some cases, the temperature of the electrode in the electronic component reaches 250 to 260° C. Accordingly, in the case where the solder material at the joint for internally joining the electronic element in the electronic component to the electrode has a melting point of from 200 to 230° C., the solder material at the joint of the electronic element and the electrode might melt when soldering the electronic component to another board. Melting of the solder material at the joint of the electronic element and the electrode might result in occurrence of short-circuit and/or wire disconnection and/or a change in electrical characteristics, so that a final product becomes defective.

Therefore, it is necessary to use a solder material having a higher melting point as the solder material at the joint of the electronic element and the electrode. Proposed as such a solder material is a solder material having a melting point of 270° C. or higher and containing Bi (bismuth) and a small amount of Cu (copper) (see Patent Document 1).

PRIOR ART DOCUMENT

Patent Document

Patent Document 1: Japanese Laid-Open Patent Publication No. 2007-313526

DISCLOSURE OF THE INVENTION

Problem To be Solved by the Invention

However, when the solder material mainly composed of Bi and having a melting point of 270° C. or higher is used at the joint of the electronic element and the electrode, the joint readily cracks, resulting in reduced joint reliability. The reason for this will be described in detail below.

As a material for electrodes or suchlike to which electronic elements are connected, Cu is generally used because of its high conductivity and also because its price is lower than other highly conductive metals.

However, Cu has the property of oxidizing over time when it is left in the air, resulting in a thick oxidized film. Therefore, to achieve a satisfactory joint with a solder material, it is necessary to protect the surface of the electrode so as not to oxidize until just before joining by soldering. Accordingly, the surface of the electrode made of Cu is subjected to electrolytic plating to form an Ni (nickel) layer thereon, thereby preventing oxidation of the electrode.

FIG. 8 illustrates an electrode having an Ni layer formed on its surface. The electrode 120 shown as an example is made of Cu and has the Ni layer 122 of 1 to 3 μm in thickness formed for anti-oxidation on the surface through plating.

FIG. 9 illustrates the electrode having an electronic element joined thereto through soldering. Here, the electronic element 126 and the electrode 120 are connected by a joint, which includes a solder layer 124 formed by an alloy mainly composed of Bi and having a melting point of 270° C. or higher. In this case, when the joint is heated to 271° C. or higher, Bi contained in the solder layer 124 reacts with the Ni layer 122 on the surface of the electrode 120, thereby forming an intermetallic compound composed of $Bi_3Ni$. Since Bi and Ni are highly reactive, almost the entire Ni layer 122 of the joint is transformed into the intermetallic compound composed of $Bi_3Ni$. As a result, the solder layer 124 and the electrode 120 are joined via the intermetallic compound layer 128 composed of $Bi_3Ni$.

Since $Bi_3Ni$ has the property of being hard but brittle, the joint readily cracks as the intermetallic compound layer 128 becomes thicker, resulting in significantly reduced joint reliability.

The present invention has been made in view of the aforementioned problems, and aims to provide a crack-resistant, highly reliable joint structure for joining an electronic element included in an electronic component to an electrode included in that electronic component and also to provide an electronic component having such a joint structure.

Means for Solving the Problem

To attain the objectives mentioned above, the present invention provides a joint structure for joining an electronic element included in an electronic component to an electrode included in the electronic component, the structure comprising:

a solder layer for joining the electronic element and the electrode, the solder layer containing 0.2 to 6% by weight of copper, 0.02 to 0.2% by weight of germanium, and 93.8 to 99.78% by weight of bismuth;

a nickel layer provided between the solder layer and at least one of the electrode and the electronic element; and a barrier layer provided between the nickel layer and the solder layer, wherein, the barrier layer has an average thickness of from 0.5 to 4.5 µm after the electronic element and the electrode are joined by the solder layer.

In a preferred embodiment of the present invention, the barrier layer includes at least one element selected from the group consisting of silver, gold, palladium, aluminum, and titanium.

In another preferred embodiment of the present invention, the barrier layer has an initial thickness of from 1 to 5 µm.

In another preferred embodiment of the present invention, the solder layer contains 0.2 to 4% by weight of copper.

In another preferred embodiment of the present invention, the solder layer contains 0.02 to 0.1% by weight of germanium.

In another preferred embodiment of the present invention, the electrode includes copper.

In another preferred embodiment of the present invention, the electronic element is a semiconductor element.

In another preferred embodiment of the present invention, the semiconductor element contains Si, SiC, or GaN.

In another preferred embodiment of the present invention, the electronic component is a power transistor.

The present invention also provides an electronic component configured by joining an electronic element to an electrode by means of a joint including a solder layer, wherein,
the solder layer contains 0.2 to 6% by weight of copper, 0.02 to 0.2% by weight of germanium, and 93.8 to 99.78% by weight of bismuth,
the joint further includes a nickel layer provided between the solder layer and at least one of the electrode and the electronic element and a barrier layer provided between the nickel layer and the solder layer, and
the barrier layer has an average thickness of from 0.5 to 4.5 µm after the electronic element and the electrode are joined by the solder layer.

In a preferred embodiment of the electronic component of the present invention, the barrier layer has an initial thickness of from 1 to 5 µm.

Effect of the Invention

In the present invention, a joint structure for joining an electronic element included in an electronic component to an electrode included in that electronic component includes a solder layer, which is made from a solder material mainly composed of Bi (bismuth), an Ni (nickel) layer, and a barrier layer interposed therebetween. The barrier layer has an average thickness of from 0.5 to 4.5 µm after the electronic element and the electrode are joined by the solder layer, which makes it possible to prevent a less crack-resistant intermetallic compound composed of Bi₃Ni from being produced through reaction of Bi in the solder layer with Ni in the Ni layer. Thus, it is possible to achieve a joint structure with increased reliability.

In order for the barrier layer to have an average thickness of from 0.5 to 4.5 µm after the electronic element and the electrode are joined by the solder layer, the barrier layer preferably has an initial thickness of from 1 to 5 µm. This makes it possible to reliably prevent an intermetallic compound composed of Bi₃Ni from being produced due to loss of the barrier layer at the time of the joining.

Also, since the solder material mainly composed of Bi contains 0.02 to 0.2% by weight of germanium, it is possible to significantly suppress oxide production (see FIG. 2). Thus, it is possible to achieve a joint structure with further increased reliability.

Also, the solder material mainly composed of Bi has a melting point of 270° C. or higher. On the other hand, a solder material used for mounting the electronic component onto another board or suchlike typically has a melting point of from 200 to 230° C. This makes it possible to prevent the solder material for joining the electronic element to the electrode from melting due to heat when mounting the electronic component onto another board or suchlike. Thus, it is also possible to achieve the effect of preventing defects such as wire disconnection from occurring in the electronic component.

BEST MODE FOR CARRYING OUT THE INVENTION

Hereinafter, embodiments of the present invention will be described with reference to the drawings.

Embodiment 1

Figure 1:
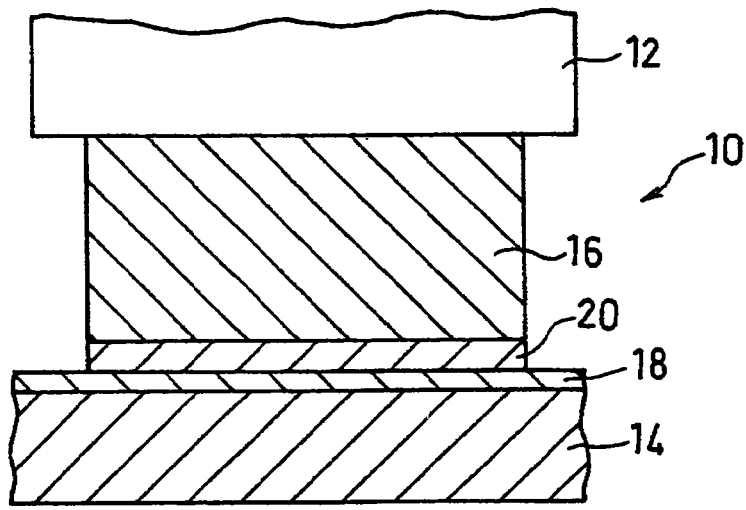
FIG. 1 is a partial cross-sectional view illustrating a schematic configuration of a joint structure according to Embodiment 1 of the present invention.

FIG. 1 illustrates in cross section a schematic configuration of a joint structure according to Embodiment 1 of the present invention. The joint structure 10 shown as an example is a joint structure for joining an electronic element 12 included in an unillustrated electronic component to an electrode 14 included in that electronic component. Note that in FIG. 1, the electronic element 12 is not shown in cross section, and its schematic geometry is shown by an open graphic.

Although not limited to any specific element, the electronic element 12 can be, for example, an Si (silicon) element, a GaN (gallium nitride) element, or an SiC (silicon carbide) element. When the electronic element 12 is any of these elements, the electronic component is configured as a transistor or a power transistor (a transistor generally having a maximum collector dissipation of 1 W or more).

The electrode 14 is mainly composed of Cu (copper).

The joint structure 10 includes a solder layer 16 for joining the electronic element 12 and the electrode 14, an Ni (nickel) layer 18 formed on the surface of the electrode 14, and a barrier layer 20 interposed between the solder layer 16 and the Ni layer 18.

The solder layer 16 is made using an alloy (solder material) with a Bi (bismuth) content of 90% or more. More specifically, preferably used as a solder material for the solder layer 16 is an alloy containing 0.2 to 6% by weight of Cu, 0.02 to 0.2% by weight of Ge (germanium), and 93.8 to 99.78% by weight of Bi.

More preferably, the solder material contains 0.2 to 4% by weight of Cu and 0.02 to 0.1% by weight of Ge. A Cu content of 0.2% or more by weight makes it possible to ensure satisfactory wettability of the solder material. Also, a Cu content of 4% or less by weight makes it possible to prevent the solder layer 16 from melting even when it is heated to about 270° C.

Figure 2:
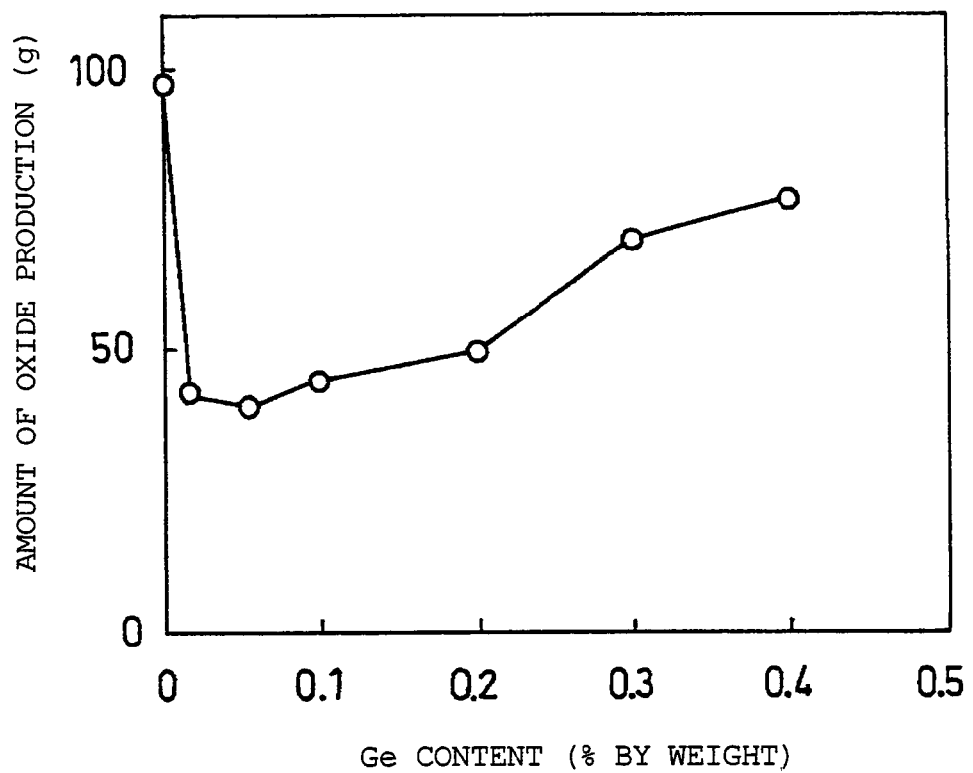
FIG. 2 is a graph illustrating the relationship between germanium contained in a solder material and the amount of oxide production.

Also, a Ge content of 0.02% or more by weight makes it possible to significantly suppress oxide production. FIG. 2 illustrates the relationship between Ge content and the amount of oxide production.

On the other hand, a Ge content of 0.1% or less by weight makes it possible to minimize cost increase.

Also, since the solder layer 16 made from the alloy having a composition as described above has a melting point of from 270 to 275° C., it is possible to prevent occurrence of any defects such as wire disconnection due to the solder layer 16 melting when mounting the electronic component onto another board or suchlike. This is because solder materials for use in mounting an electronic component onto a board or suchlike typically have a melting point of from 200 to 230° C.

The Ni layer 18 is a layer provided for preventing oxidation of the electrode 14 composed of Cu, and can be formed through Ni plating.

The barrier layer 20 is a layer provided for preventing production of an intermetallic compound composed of $Bi_3Ni$ due to reaction of Ni contained in the Ni layer 18 and Bi included in the solder layer 16. The barrier layer 20 can be made from a material which does not produce a compound in concert with Bi. Examples of such a material include Ag (silver), Au (gold), Pd (palladium), Al (aluminum), and Ti (titanium). Among them, Ag, Au, and Ti are preferable from the viewpoint of anti-oxidation properties and satisfactory wettability, and furthermore, Ag is most preferable considering cost and joint performance with Bi.

The barrier layer 20 is formed so as to have an average thickness of from 0.5 to 4.5 µm after the joining by the solder layer 16. Accordingly, the barrier layer 20 preferably has an initial thickness of from 1 to 5 µm before the joining (i.e., soldering) by the solder layer 16. By providing the barrier layer 20 in an initial thickness of 1 µm or more, it becomes possible to avoid loss of the barrier layer 20 under the influence of heat or suchlike at the time of the joining by the solder layer 16. Also, by providing the barrier layer 20 in an initial thickness of 5 µm or less, it becomes possible to avoid cost increase.

Here, the average thickness of the barrier layer 20 after the joining by the solder layer 16 can be measured by cutting a joined sample by means of a precision cutter such that its cross section can be seen and smoothening the cross section by means of a polishing device, and thereafter by magnifying the cross section, for example, 3,000 times by means of an electronic microscope and calculating an average for thicknesses measured at a plurality (e.g., ten) of arbitrary points. The initial thickness of the barrier layer 20 can be measured in a similar manner.

Since Bi produces no compound in concert with a metal contained in the barrier layer 20, Bi and the metal contained in the barrier layer 20 are joined as a result of gradual diffusion of Bi and the metal contained in the barrier layer 20. Therefore, unlike in the case of Bi and Ni, no intermetallic compound layer is produced at a joint interface in a short period of time.

As described above, the barrier layer 20 composed of, for example, Ag can be formed between the Ni layer 18 and the solder layer 16 so as to have an average thickness of from 0.5 to 4.5 µm after the joining by the solder layer 16, thereby reliably preventing production of an intermetallic compound composed of $Bi_3Ni$.

Figure 3:
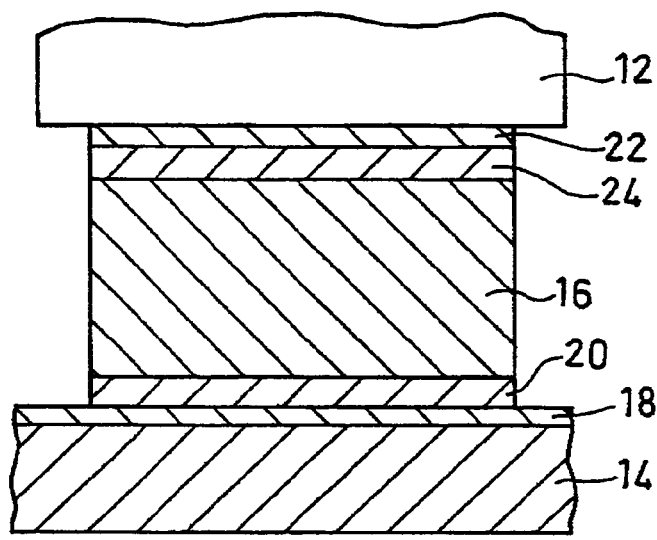
FIG. 3 is a partial cross-sectional view illustrating a schematic configuration of a variant on the joint structure according to Embodiment 1.

Here, the barrier layer 20 is not provided only on the electrode 14 side. As shown in FIG. 3, when an Ni layer 22 is provided on the surface of the electronic element 12, a barrier layer 24 can be provided between the solder layer 16 and the Ni layer 22 on the electronic element 12 side. As a result, it is possible to prevent the Ni layer 22 on the surface of the electronic element 12 from reacting with Bi in the solder layer 16, resulting in production of an intermetallic compound composed of $Bi_3Ni$.

Described next are examples of the present invention. The present invention is not limited to the following examples.

Examples

Figure 4A:
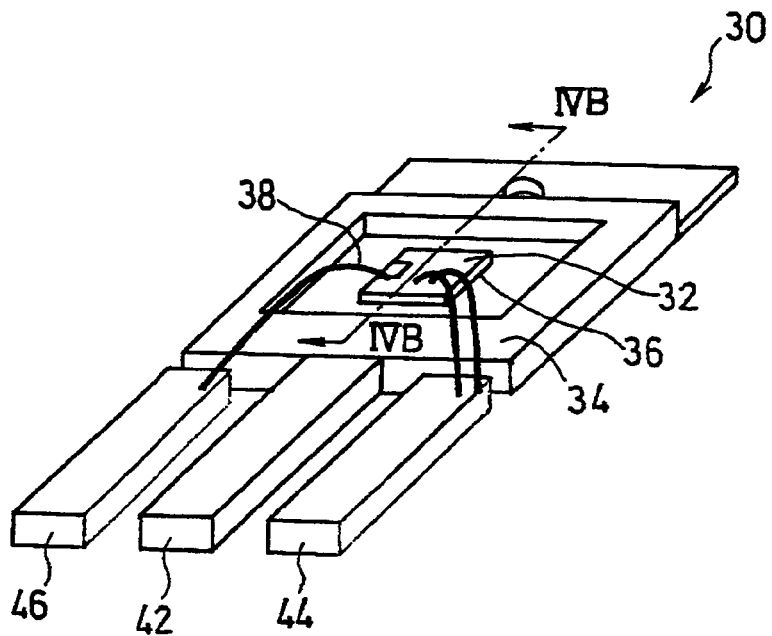
FIG. 4A is a perspective view illustrating a schematic configuration of an electronic component according to an embodiment of the present invention.
Figure 4B:
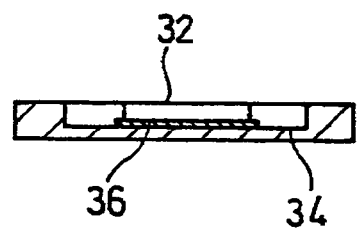
FIG. 4B is a cross-sectional view of the electronic component.

As an electronic component, a transistor 30, including a discrete IGBT, was made as shown in FIGS. 4A and 4B. FIG. 4A is a perspective view of the transistor 30, and FIG. 4B is a cross-sectional view taken along line IVB-IVB of FIG. 4A.

The transistor 30 includes an Si element 32, which is an electronic element 12, a lead frame 34, which is an electrode joined to the Si element 32, and other electrodes. The lead frame 34 is mainly composed of Cu. The Si element 32 has a plurality (in the figure, four) of terminals. The Si element 32 is connected at one terminal directly to the lead frame 34 by means of a joint 36.

The Si element 32 is connected at other terminals to their respective other electrodes via aluminum wires 38. Also, the Si element 32 is sealed and protected by an unillustrated epoxy-resin mold.

Also, the transistor 30 is used after being mounted on another board (not shown) with external terminals 42, 44, and 46 joined to electrodes of that board by means of a solder material having a melting point of 230° C. or lower.

The joint 36 includes a solder layer 16, an Ni layer 18 formed on the surface of the lead frame 34, and a barrier layer 20 formed on the Ni layer 18.

The solder layer 16 was made from a solder material having a melting point of 274° C. and containing 99.14% by weight of Bi, 0.8% by weight of Cu, 0.06% by weight of Ge, and some unavoidable impurities. The solder layer 16 was 40 µm thick.

The Ni layer 18 was 2 µm thick. The barrier layer 20 was formed by Ag plating so as to have a thickness of 3 µm.

Joining by the solder layer 16 was carried out for four patterns of soldering time: 5 seconds (Example 1); 10 seconds (Example 2); 20 seconds (Example 3); and 30 seconds (Example 4), and ten transistors 30 were produced for each of the four patterns of soldering time. Here, the soldering time refers to a period of time from the point when the solder material melts until the temperature falls below the melting point. Also, the soldering temperature (the temperature of the solder material) was adjusted in accordance with the soldering time.

Figure 5:
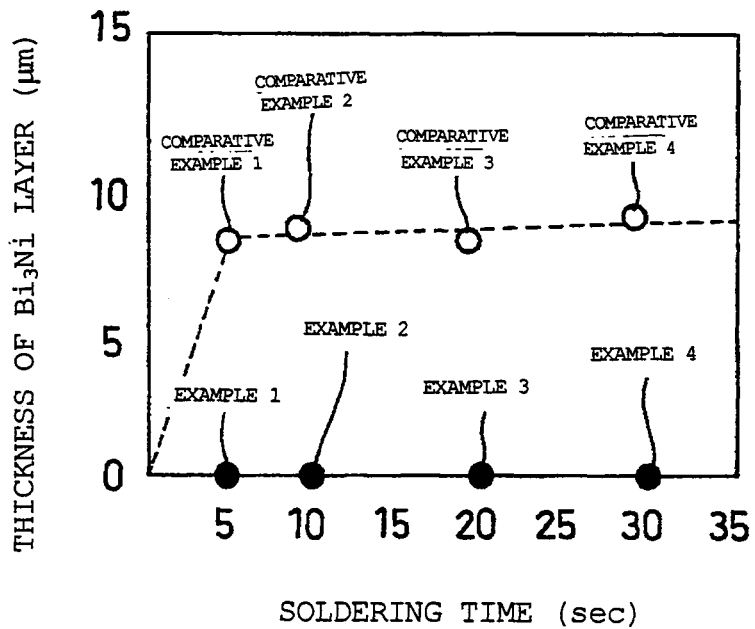
FIG. 5 is a graph illustrating the relationship between soldering time and the thickness of a Bi₃Ni layer in examples of the present invention and comparative examples.

In this manner, a total of 40 transistors 30 were produced as specimens. Then, the specimens were tested as to whether or not $Bi_3Ni$ was produced at the joint 36. The results are shown in the graph of FIG. 5.

Figure 6:
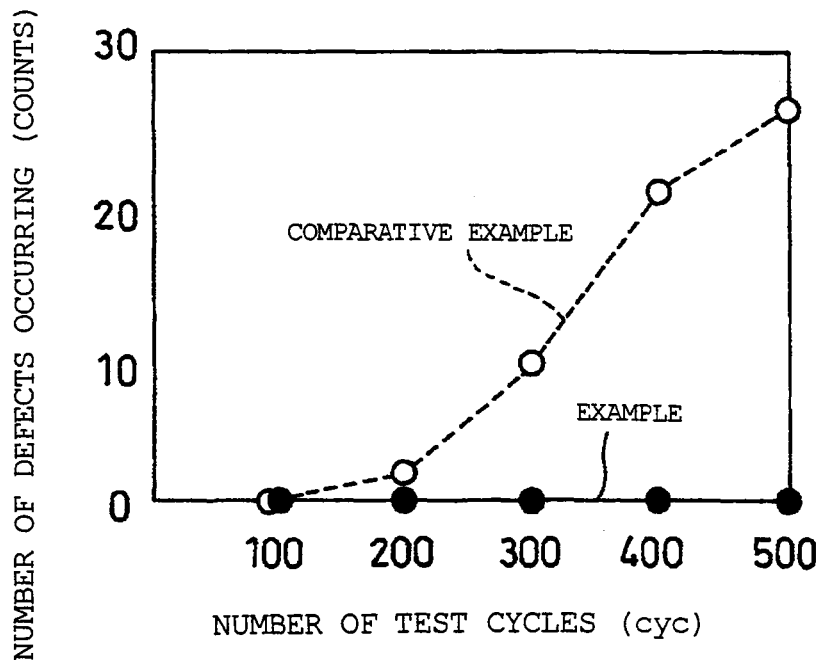
FIG. 6 is a graph illustrating the relationship between the number of cycles in temperature cycle testing and the number of defects occurring in examples of the present invention and comparative examples.
Figure 7:
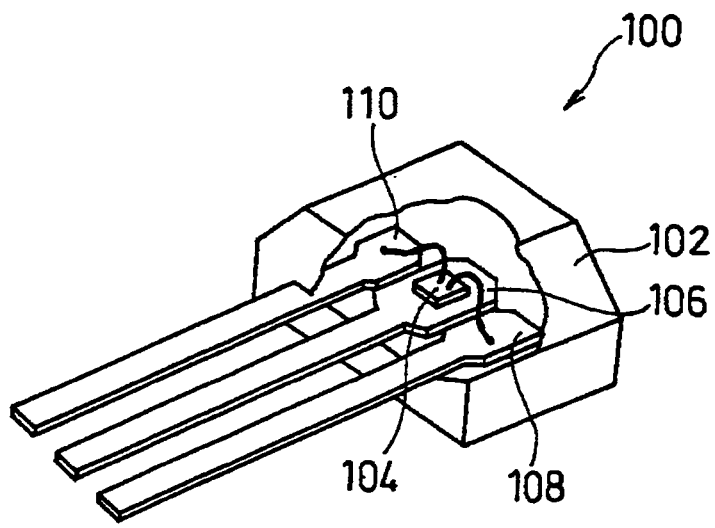
FIG. 7 is a partial perspective view illustrating a schematic configuration of a conventional electronic component.
Figure 8:
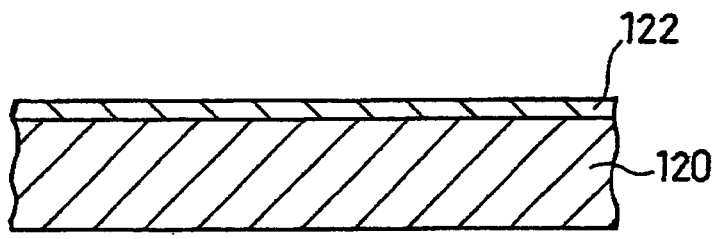
FIG. 8 is a cross-sectional view illustrating a schematic configuration of an electrode in the conventional electronic component.
Figure 9:
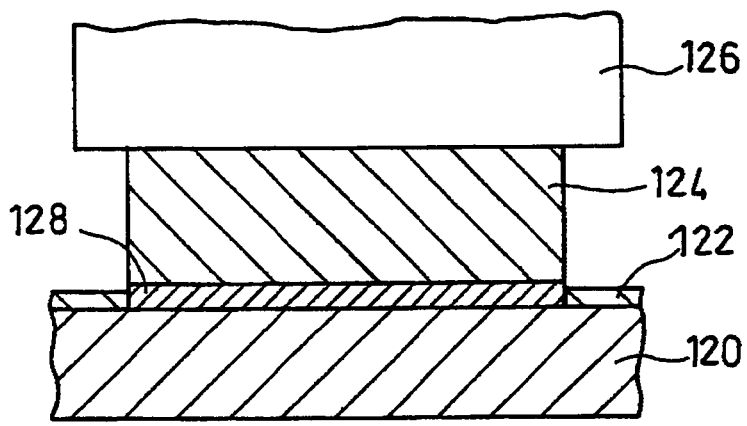
FIG. 9 is a cross-sectional view illustrating a schematic configuration of a joint structure in the conventional electronic component.

Also, the transistors 30 according to Examples 1 to 4 were tested for joint reliability by temperature cycle testing. In the test, the number of specimens with joint defects were counted every 100 cycles at 100th, 200th, 300th, 400th, and 500th cycles where in each cycle, the transistors 30 were held for 30 minutes in an atmosphere at 150° C. and then for another 30 minutes in an atmosphere at −65° C. The results are shown in the graph of FIG. 6. Here, the joint defect refers to a state where a crack or suchlike occurs at the joint so that no conduction is provided.

Comparative Examples

Specimens were produced using discrete IGBTs in the same manner as in the aforementioned examples except that no barrier layer 20 was provided between the Ni layer 18 and the solder layer 16. In this case, ten specimens were produced for each of four patterns of soldering time: 5 seconds (Comparative Example 1); 10 seconds (Comparative Example 2); 20 seconds (Comparative Example 3); and 30 seconds (Comparative Example 4). Then, regarding whether or not $Bi_3Ni$ was produced at the joint, the specimens were tested in the same manner as in the aforementioned examples, and also tested for joint reliability as well. The results are shown in FIGS. 5 and 6.

Evaluation

As shown in FIG. 5, in Examples 1 to 4 where the barrier layer 20 was provided between the Ni layer 18 and the solder layer 16, no intermetallic compound composed of $Bi_3Ni$ was produced even when the soldering time was set at 30 seconds. On the other hand, in the comparative examples where no barrier layer 20 was provided, the intermetallic compound layer composed of $Bi_3Ni$ was formed for all Comparative Examples 1 to 4.

An average thickness of the intermetallic compound layer was 8 μm, which shows 20% of the 40 μm-thick solder layer 16 turned into that hard and brittle intermetallic compound layer. Also, this means that the solder layer, which functions as a stress relaxation layer to maintain joint reliability because the intermetallic compound layer does not function as such, is reduced to 32 μm, which corresponds to 80% of the original thickness.

From the above results, it can be appreciated that formation of the barrier layer 20, which contains sufficiently thick μg, between the Ni layer 18 and the solder layer 16 makes it possible to prevent production of the intermetallic compound composed of $Bi_3Ni$, thereby increasing joint reliability.

Also, as is apparent from FIG. 6, in Comparative Examples 1 to 4 where no barrier layer 20 was provided between the Ni layer 18 and the solder layer 16, joint defects occurred during the 200-cycle temperature cycle testing. Then, the number of defects occurring increased with the number of cycles, and in the 500-cycle temperature cycle testing, 27 out of 40 specimens had joint defects.

On the other hand, in Examples 1 to 4 where the barrier layer 20 was provided between the Ni layer 18 and the solder layer 16, no specimen had any joint defects even during the 500-cycle temperature cycle testing.

From the above results, it can be appreciated that joint reliability can be significantly increased by providing the barrier layer 20 having an initial thickness of from 1 to 5 μm between the Ni layer 18 and the solder layer 16.

INDUSTRIAL APPLICABILITY

The present invention increases the reliability of a joint structure for an electronic element and an electrode included in an electronic component. Thus, the present invention is preferably applicable to electronic products such as transistors, SOPs, QFPs, CSPs, chip inductors, and capacitors.

DESCRIPTION OF THE REFERENCE CHARACTERS 10 joint structure
12 electronic element
14 electrode
16 solder layer
18, 22 Ni layer
20, 24 barrier layer

The invention claimed is:

1. A joint structure comprising: an electronic element included in an electronic component; an electrode included in the electronic component; and a joint for joining the electronic element and the electrode,
said joint comprising:
a solder layer provided between the electronic element and the electrode, the solder layer containing 0.2 to 6% by weight of copper, 0.02 to 0.2% by weight of germanium, and 93.8 to 99.78% by weight of bismuth;
a nickel layer provided at least one of between the solder layer and the electrode and between the solder layer and the electronic element; and
a barrier layer provided between the nickel layer and the solder layer, wherein,
the barrier layer has an average thickness of from 0.5 to 4.5 μm.

2. The joint structure according to claim 1, wherein the barrier layer includes at least one element selected from the group consisting of silver, gold, palladium, aluminum, and titanium.

3. The joint structure according to claim 1, wherein the barrier layer has an initial thickness of from 1 to 5 μm.

4. The joint structure according to claim 1, wherein the solder layer contains 0.2 to 4% by weight of copper.

5. The joint structure according to claim 1, wherein the solder layer contains 0.02 to 0.1% by weight of germanium.

6. The joint structure according to claim 1, wherein the electrode includes copper.

7. The joint structure according to claim 1, wherein the electronic element is a semiconductor element.

8. The joint structure according to claim 7, wherein the semiconductor element contains Si, SiC, or GaN.

9. The joint structure according to claim 8, wherein the electronic component is a power transistor.

10. An electronic component comprising: an electronic element; an electrode; and a joint for joining the electronic element and the electrode,
said joint comprising:
a solder layer provided between the electronic element and the electrode, the solder layer containing 0.2 to 6% by weight of copper, 0.02 to 0.2% by weight of germanium, and 93.8 to 99.78% by weight of bismuth,
a nickel layer provided at least one of between the solder layer and the electrode and between the solder layer and the electronic element and a barrier layer provided between the nickel layer and the solder layer, wherein
the barrier layer has an average thickness of from 0.5 to 4.5 μm.

11. The electronic component according to claim 10, wherein the barrier layer has an initial thickness of from 1 to 5 μm.

* * * * *